United States Patent [19]
Schweitzer, Jr.

[11] Patent Number: 5,153,565
[45] Date of Patent: Oct. 6, 1992

[54] FAULT INDICATOR HAVING ELECTROSTATICALLY-ACTUATED INDICATOR FLAG

[76] Inventor: Edmund O. Schweitzer, Jr., 2433 Center St., Northbrook, Ill. 60062

[21] Appl. No.: 230,598

[22] Filed: Aug. 10, 1988

[51] Int. Cl.⁵ .............................. G08B 21/00
[52] U.S. Cl. .................. 340/650; 324/133; 324/529; 324/543
[58] Field of Search ............... 324/59, 180, 179, 519, 324/537, 539, 541, 542, 543, 555, 556, 133, 529, 686, 690; 340/650, 652

[56] References Cited

U.S. PATENT DOCUMENTS

| | | | |
|---|---|---|---|
| 405,572 | 6/1889 | Loomis | 340/650 |
| 2,610,030 | 9/1953 | Gardner | 340/650 |
| 3,406,477 | 9/1975 | Schweitzer, Jr. | 340/650 |
| 3,496,559 | 2/1970 | Brumfield | 340/650 |
| 3,594,767 | 7/1971 | Link | 324/133 |
| 3,866,197 | 2/1975 | Schweitzer, Jr. | 340/650 |

Primary Examiner—Joseph A. Orsino
Assistant Examiner—Jill Jackson
Attorney, Agent, or Firm—Lockwood, Alex, FitzGibbon & Cummings

[57] ABSTRACT

A fault indicator for indicating the occurrence of a fault current in a monitored conductor includes an electrostatically-actuated indicator assembly. During normal operation a lightweight indicator flag rotatably mounted in and viewable from the exterior of the indicator housing is held in a reset-indicating position by electrostatic force resulting from an electric field existing between the flag and adjacent electrodes. Upon occurrence of a fault current in the monitored conductor the electric field is removed and the indicator flag, under the influence of a permanent magnet, is caused to rotate to a fault-indicating position. By avoiding the use of magnetic actuator windings and associated pole pieces the indicator assembly is easier and more economical to construct.

23 Claims, 4 Drawing Sheets

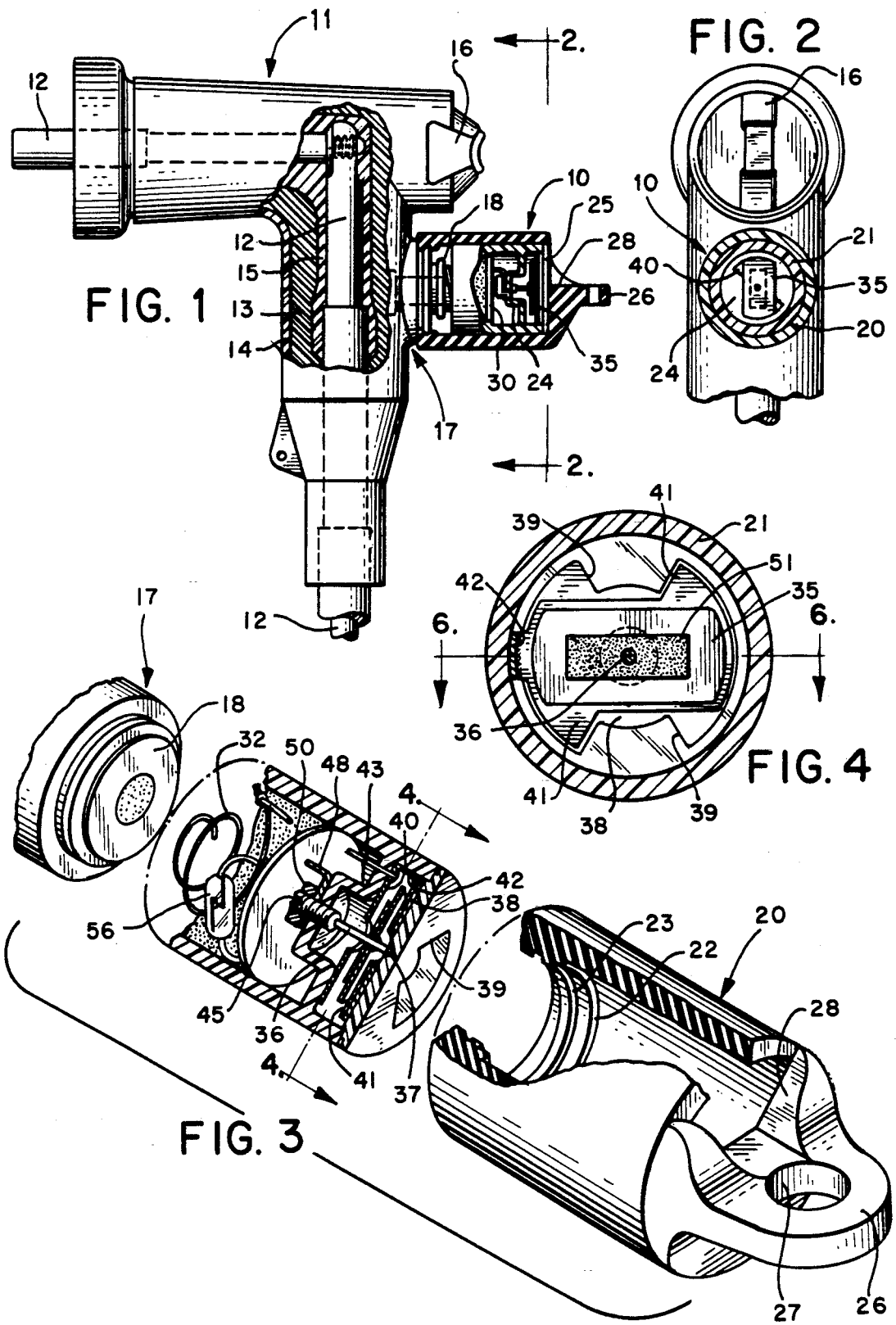

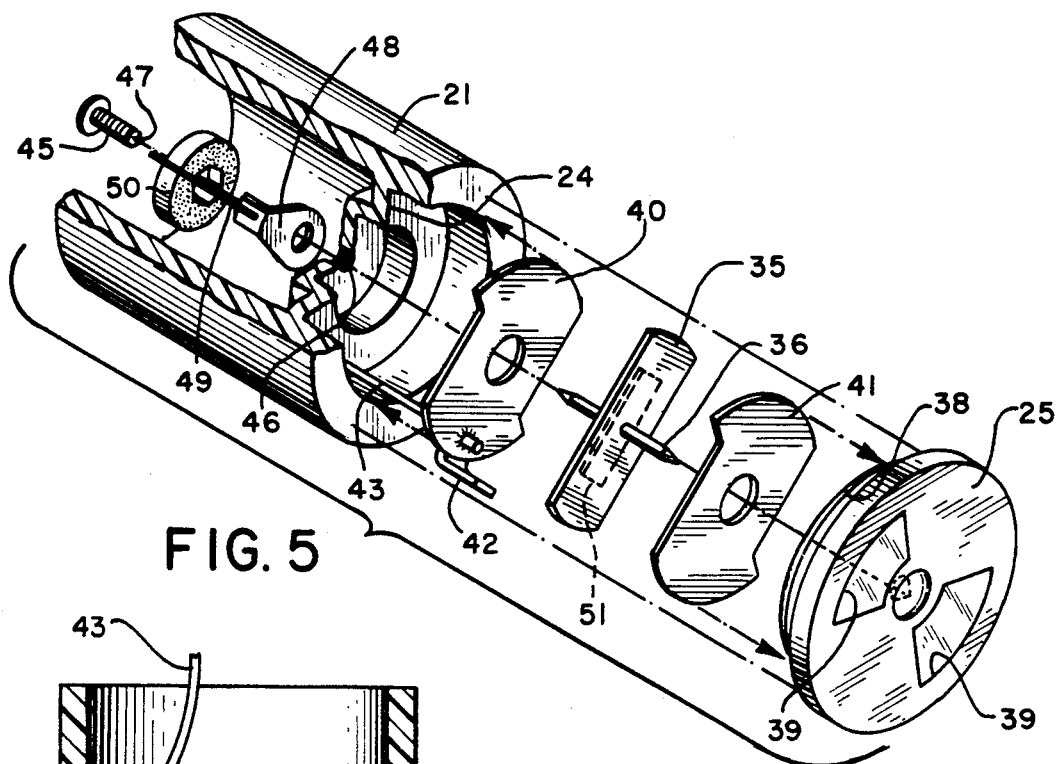
FIG. 5
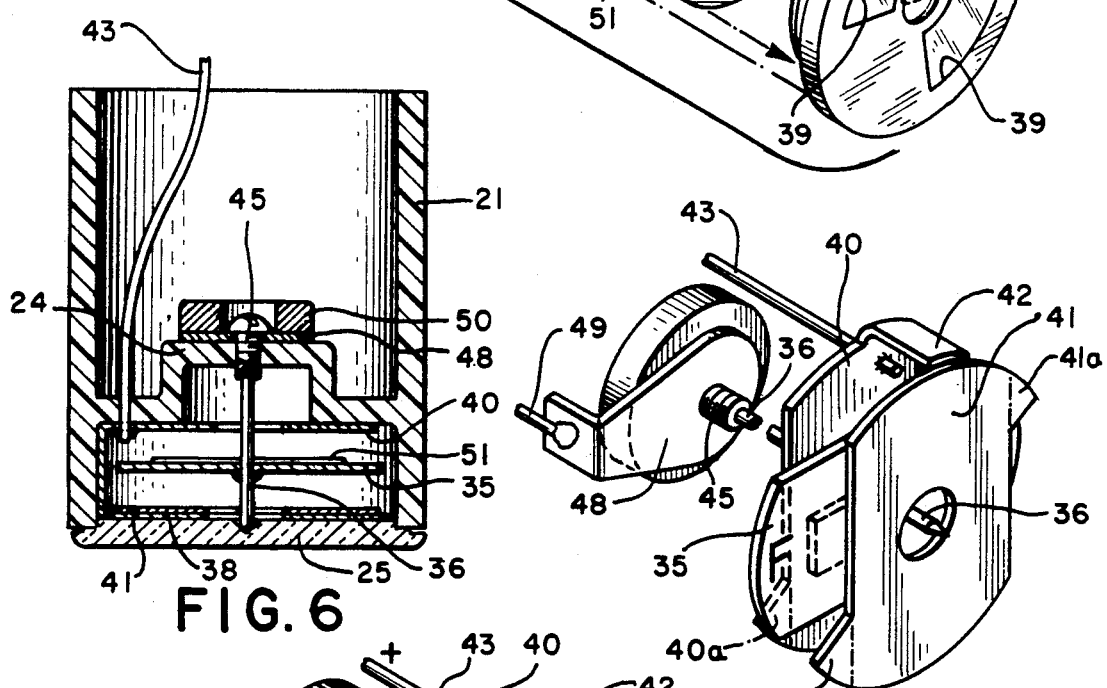
FIG. 6
FIG. 8
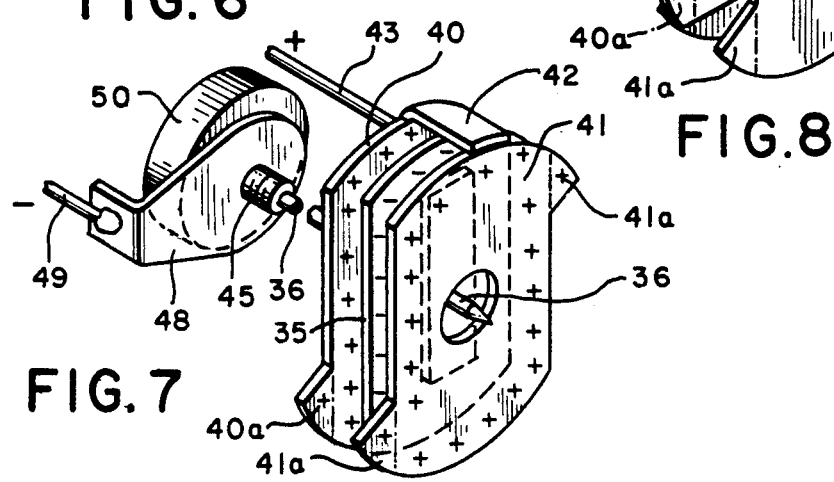
FIG. 7

FAULT INDICATOR HAVING ELECTROSTATICALLY-ACTUATED INDICATOR FLAG

BACKGROUND OF THE INVENTION

The present invention relates generally to indicating devices for electrical systems, and more particularly to a fault indicator device and electrostatically-actuated indicator assembly for use therein.

Various types of fault indicators have been constructed for detecting faults in power distribution systems, including clamp-on type fault indicators, which clamp directly over cables in the system, and test-point type fault indicators, which are mounted over test points in the cables or associated connectors. Such fault indicators may be either of the manually reset type, wherein it is necessary that the indicator be physically reset following each fault, or of the automatically reset type, wherein a fault indication is reset upon restoration of line current. Examples of such fault indicators are found in products manufactured by E. O. Schweitzer Mfg. Co. of Mundelein, Ill., and in U.S. Pat. Nos. 3,676,740, 3,906,477, 4,063,171, 4,414,543, 4,438,403, 4,495,489, 4,686,518, 4,706,016 and 4,714,916 of the present inventor.

Detection of fault currents by self-resetting fault indicators is often most advantageously accomplished by means of a reed switch located within the indicator housing having contacts in close proximity to the conductor being monitored. Upon occurrence of an abnormally high fault-associated magnetic field around the conductor, the contacts close and actuate circuitry which positions to a fault-indicating position an indicator flag visible from the exterior of the indicator. Upon restoration of current in the conductor the circuit repositions the indicator flag to a reset or non-fault indicating position.

The present invention is directed to a fault indicator and electrostatically-actuated indicator assembly for use therein, which, by avoiding the use of magnetic windings and associated magnetic pole pieces as used in previous indicator assemblies, decrease the complexity and cost of manufacturing of the fault indicator. In particular, the indicator construction of the invention utilizes a rotatably mounted indicator flag formed of a light-weight foil material which is positioned in a reset indicating position by electrostatic attraction to adjacent foil electrode surfaces which are maintained at a high electrical potential relative to the indicator flag by a capacitor charged from the power line, and to a fault-indicating position by a permanent magnet which magnetically positions the indicator flag in the absence of the electrostatic attraction. In an alternate version, the indicator flag is maintained in the reset-indicating position by magnetic attraction, and in the fault-indicating position by electrostatic attraction.

Accordingly, it is a general object of the present invention to provide a new and improved fault indicator.

It is a more specific object of the present invention to provide a new and improved fault indicator having an electrostatically-actuated indicator flag for indicating the occurrence of a fault current.

It is a further object of the present invention to provide for use with a fault indicator or the like an electrostatically-actuated indicator assembly which is simple and inexpensive to manufacture.

SUMMARY OF THE INVENTION

The invention is directed to a fault indicator for indicating the occurrence of a fault current in an electrical conductor. The indicator includes a housing, an indicator flag mounted in the housing for movement between a fault-indicating position and a reset-indicating position, electrostatic-actuator means including at least one electrode, circuit means connected to the electrode and to the indicator flag for establishing an electrostatic field between the one electrode and the indicator flag to bias the indicator flag to a selected one of the indicating positions, and biasing means for positioning the indicator flag to the other of the positions in the absence of the electrostatic field, wherein the circuit means are responsive to the occurrence of a fault current in the electrical conductor to condition the indicator flag to the fault-indicating state.

The invention is further directed to an electrostatically-actuated indicator for indicating one of two alternative conditions in response to an applied control effect. The indicator includes a housing, an indicator flag mounted in the housing for movement between a first indicating position and a second indicating position, electrostatic actuator means including at least one electrode, circuit means electrically connected to the electrode and to the indicator flag for establishing an electrostatic field between the electrode and the indicator flag to position the indicator flag to a selected one of the indicating positions, biasing means for positioning the indicator flag to the other of the indicating positions in the absence of the electrostatic field, the circuit means being responsive to the control effect in positioning the indicator flag to the first indicating state.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

FIG. 1 is a side elevational view, partially in section, illustrating a test-point mounted fault indicator having an electrostatically-actuated indicator constructed in accordance with the invention mounted on the test-point of a plug-in terminal connector.

FIG. 2 is a cross-sectional view of the fault indicator and connector taken along line 2—2 in FIG. 1.

FIG. 3 is an enlarged fragmentary perspective view of the fault indicator in a partially disassembled state.

FIG. 4 is a cross-sectional view of the fault indicator taken along line 4—4 of FIG. 3.

FIG. 5 is an enlarged exploded perspective view showing the principal components of the electrostatically-actuated indicator utilized in the fault indicator of FIGS. 1-4.

FIG. 6 is a cross-sectional view of the indicator taken long line 5—5 of FIG. 4.

FIG. 7 is a perspective view of certain principal components of the indicator in a reset-indicating position.

FIG. 8 is a perspective view similar to FIG. 7 showing the principal components in a fault-indicating position.

DESCRIPTION OF THE PREFERRED EMBODIMENT

Figure 9:
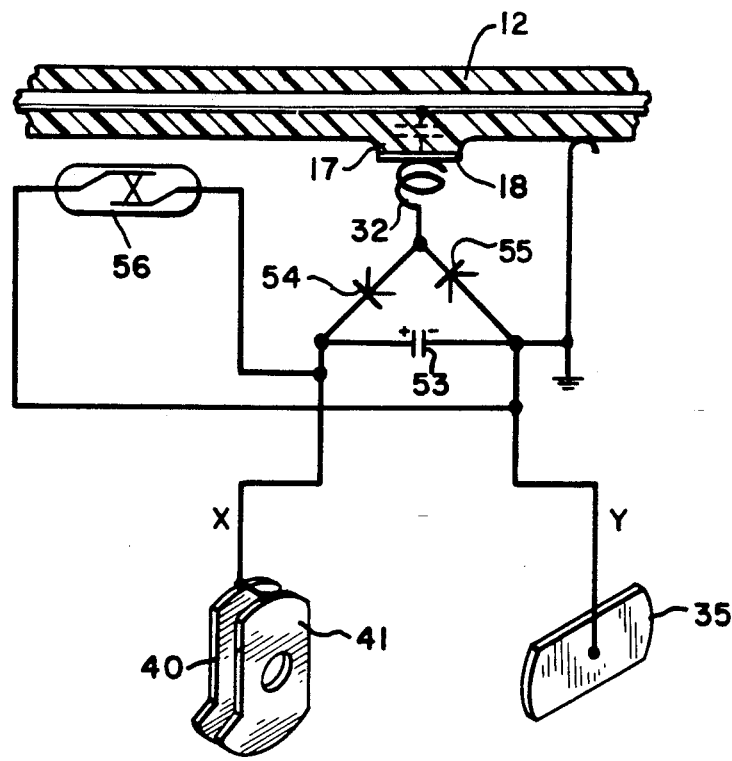
FIG. 9 is an electrical schematic diagram of the fault indicator.

Referring to the drawings, and particularly to FIGS. 1-4, a fault indicator 10 constructed in accordance with the invention is shown in conjunction with a conventional plug-in terminal connector 11 of the type commonly used in high voltage alternating current systems for establishing plug-in connections to transformers or other devices (not shown). As shown, the connector 11 includes generally an axial conductor 12 extending through an insulating jacket 13 having an electrically-conductive grounded outer layer 14 and an electrical stress relief layer 15. An arcuate member 16 having ends anchored in jacket 13 extends from the connector to receive the hooked end of a lineman's tool to facilitate removal of the connector from the transformer or other device.

In accordance with conventional practice, connector 11 includes a test point terminal 17 which provides a capacitive coupling to conductor 12. Basically, this test point is formed by a projection of the insulating layer 13 in which a metallic contact 18 is embedded so as to be capacitively coupled to the conductor. Various monitoring devices, such as certain of the aforementioned fault indicators manufactured by Schweitzer Manufacturing Company, may be installed on this test point.

The fault indicator 10 installed on test point 17 is seen to include an electrically conductive hollow rubber outer shell 20 which is open at one end to receive the test point terminal. A correspondingly sized cylindrical plastic housing 21 containing the electrical components of the fault indicator is contained within the rubber shell, and held in position within the shell by an annular flange portion 22 on the inside surface of the shell adjacent the open end thereof. The annular flange portion may also include at the open end thereof a rim portion 23 to secure the shell over the test point.

As shown in FIG. 3, the cylindrical housing 21 includes an integral partition 24 which serves as a mask and spacing element, and a transparent end cap 25 which is sonically welded to the end of the housing and provides means by which the user can view the interior of the housing. A tab portion 26 at the closed end of shell 20 includes an aperture 27 by which the shell 20 can be removed. A window 28 in the end of the shell allows the transparent end cap 25 to be viewed.

Referring to FIGS. 3-6, a disc-shaped insulator board 30 may be positioned within housing 21 to serve as a mounting means for the electrical components of the fault indicator. A layer of epoxy 31 may be provided to secure the circuit board 30 and the components mounted thereon in position. An electrical connection is established between the circuitry of the fault indicator and test point 17 by means of a helical spring 32, the spring being connected to a wire conductor 33 extending from the circuit board at one end, and being resiliently pressed against contact 18 at its other end when the fault indicator is installed on the connector as shown in FIG. 1. An electrical ground connection may be established to the circuit board by means of an additional electrical conductor 34 compressively wedged between housing 21 and the grounded electrically conductive outer shell 20.

To provide an indication of the occurrence of a fault current in conductor 12, fault indicator 10 includes within the lower end of housing 21 a segmented indicator flag 35 which is mounted for rotation on a shaft 36 aligned with the axis of the housing. The forward end of shaft 36 is secured within a central recess 37 on the inside surface of end cap 25. An opaque mask 38 may be provided on the inside surface of the transparent end cap to form diametrically opposed windows 39 through which the indicator flag 35 can be seen, as shown in FIG. 5.

To position indicator flag 35 in its reset indicating position, wherein it is not visible through windows 39, the indicator assembly of fault indicator 10 includes electrostatic actuator means in the form of a pair of segmented electrodes 40 and 41 arranged on opposite sides of the indicator flag in respective planes perpendicular to the axis of rotation of the indicator flag. More specifically, the two electrodes 40 and 41, which may each be formed of a thin electrically-conductive metallic foil, or alternatively may be deposited as electrically-conductive film or paint on the surfaces of baffle 24 and end cap 35, are connected to each other by an electrical bridging segment 42 and to the fault indicator circuitry by a wire connecting element 43. As thus arranged, the two electrodes 40 and 41 generally overlie two similarly shaped portions of indicator flag 35 when the indicator flag is in its reset-indicating position. With this layered configuration of paired electrodes the electrostatic attraction between the electrodes and the indicator flag is increased over that available from a single electrode for increased indicator sensitivity and reliability. Where such a sensitivity increase is not required, a single electrode construction can be utilized.

To facilitate effective electrostatic attraction between the indicator flag and the electrodes, the indicator flag is preferably constructed of a thin light-weight metallic foil having sufficient rigidity to maintain a perpendicular alignment with shaft 36.

Electrical communication is established with the electrically conductive foil of indicator flag 35 by means of a set screw 45 which extends through and threadingly engages a threaded aperture 46 in baffle 24, and which includes a recess 47 at one end for receiving the corresponding end of shaft 36. A lug 48 and wire conductor 49 provide an electrical connection to the indicator flag when engaged by machine screw 50.

When an electric field is produced between indicator flag 35 and electrodes 40 and 41 as shown in FIG. 7, the electrostatic attraction between the indicator flag and the electrodes causes the indicator flag to rotate until the flag is aligned in the reset-indicating position shown in FIG. 7. Electrodes 40 and 41 are preferably unsymmetrical about a line perpendicular to the axis of rotation of the indicator flag so as to impart in the presence of the electric field a rotational torque to the flag. In the present embodiment, electrode portions 40a and 41a (FIGS. 7 and 8) are provided to impart the desired rotational torque to the indicator flag. The flag remains in the reset-indicating position as long as the electric field exists. In the absence of an electric field, as following the occurrence of a fault current in conductor 12, the indicator flag is caused to rotate to the fault-indicating position shown in FIG. 8 by biasing means in the form of a washer-shaped permanent magnet 50 mounted on baffle 24 and a lightweight magnetized strip of magnetic material 51 mounted on and rotatable with indicator flag 35. In particular, in the illustrated embodiment magnet 50 provides four magnetic poles equally spaced about its circumference, with poles of like magnetic polarity diametrically opposed relative to the axis of rotation of indicator flag 35, and strip magnet 51 provides four consequentially arranged magnetic poles along a diameter of the flag, with trip of like magnetic gender at opposite ends and at the axis of rotation. Alternatively, other arrangements of one or more permanent magnets, including two pole bar or rod magnets, can be used for the biasing function. Also, other types of biasing means, such as the force of a mechanical spring or gravity, or another electric field, can be used to position the indicator flag.

The magnetic fields generated by magnet 50 causes the tape magnet 51 to exert a rotational force on the lightweight indicator flag 35 such that the flag, in the absence of an overriding electrostatic force, rotates to the fault-indicating position shown in FIG. 8. The indicator flag, which is now exposed through windows 39, may be colored red and display an "F" or other indicia to unambiguously indicate to a viewer the existence of a fault condition. Only when an electric field is again established between electrodes 40 and 41 and indicator flag 35 does the indicator flag return to the reset-indicating position of FIG. 7.

Referring to FIG. 9, in the simplest construction of the fault indicator a potential gradient sufficient to actuate indicator flag 35 is established between indicator flag 35 (denoted "Y") and electrode surfaces 40 and 41 (denoted "X") by a capacitor 53. In the presence of voltage on the monitored conductor capacitor 53 is charged from the conductor by a pair of oppositely-poled rectifiers 54 and 55 connected between test point contact 18 and respective terminals of the capacitor, each rectifier being alternately biased into conduction and non-conduction and the opposite pole of the capacitor being effectively referenced to ground. A reed switch 56 actuated by a fault level magnetic field around conductor 12 discharges capacitor 53 in the event of a fault occurrence. This allows indicator flag 35 to be repositioned from the reset-indicating position of FIG. 7 to the fault-indicating position of FIG. 8 by permanent magnets 50 and 51 such that the indicator flag indicates a fault through windows 39. The fault indication continues until such time as conductor 12 is again powered and capacitor 53 recharges to establish a potential gradient sufficient to overcome the magnetic positioning force and reposition the indicator flag to the non-fault indicating state.

Figure 10:
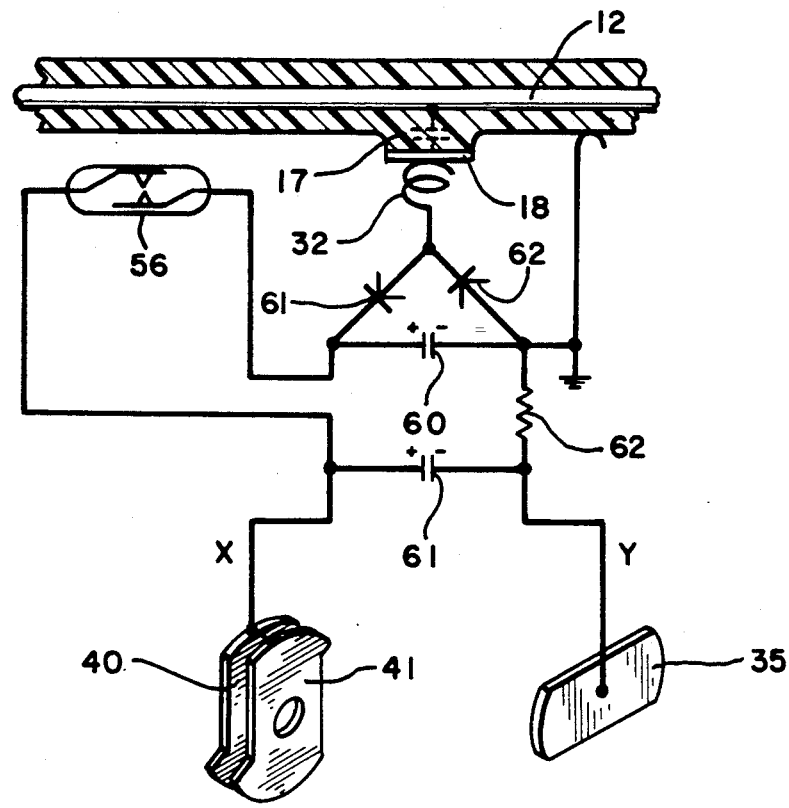
FIG. 10 is an electrical schematic diagram of an alternative construction of the fault indicator.

Referring to FIG. 10, the indicator may also be constructed to indicate a fault condition when the indicator flag is electrostatically positioned, and a reset condition when the flag is magnetically positioned. In particular, in the presence of voltage on the monitored conductor 12 a first capacitor 60 is charged through oppositely-poled diodes 61 and 62 to a high potential in the manner previously described with respect to capacitor 53. Capacitor 60 is connected through reed switch 56 to a second capacitor 61. As a result, capacitor 61 receives a portion of the charge developed on capacitor 60 only upon occurrence of a fault current and closure of switch 56. A resistor 62 limits current flow during the charge transfer. Capacitor 61, once charged, establishes the "X-Y" potential gradient which positions indicator flag 35 to a fault-indicating position where the indicator flag is positioned between electrodes 40 and 41, as in FIG. 7. To unambiguously indicate a fault with this arrangement, the surface of baffle 24 exposed through windows 39 is preferably painted red and provided with suitable indicia (not shown), and the indicator flag is painted white or another non-indicating color.

The indicator mechanism of the present invention may also be incorporated in a current-actuated fault indicator of the type utilizing a magnetic core which encircles the monitored conductor. This construction is described in U.S. Pat. No. 4,646,006, entitled "Clamp Mechanism Having Power Line Mounted Monitoring Device", of the present inventor.

Figure 11:
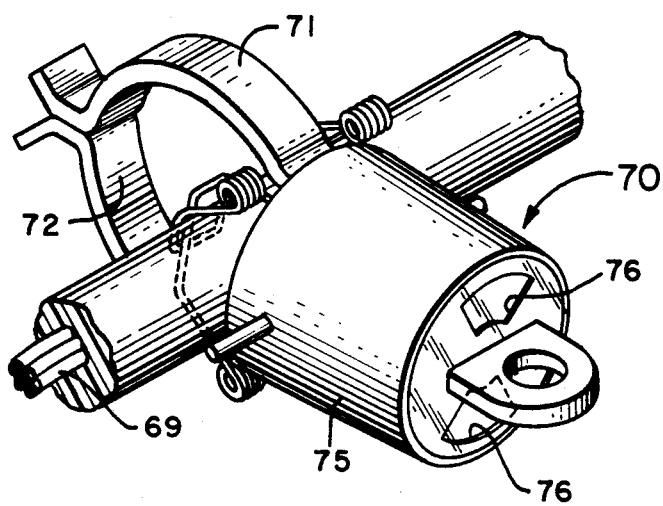
FIG. 11 is a perspective view of a cable-mounted fault indicator utilizing an electrostatically-actuated indicator constructed, in accordance with the invention.

Basically, as shown in FIG. 11, a fault indicator 70 of this construction includes a pair of magnetic core members 71 and 72 which encircle the monitored conductor 12. Spring wire clamp members 73 and 74 hold the monitored conductor in position against the surface of a generally cylindrical housing 75 containing the electrical components of the fault indicator. A pair of viewing windows 76 enable the pivotably mounted indicator flag 35 to be viewed.

Figure 12:
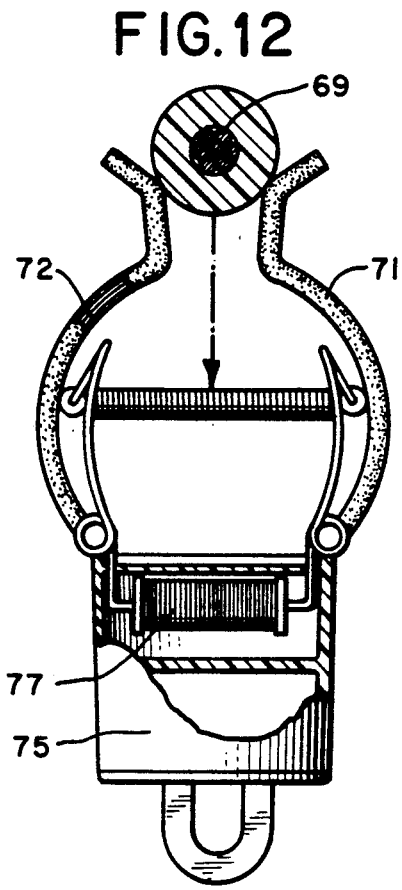
FIG. 12 is an enlarged cross-sectional view of the cable-mounted fault indicator showing the installation thereof on a monitored electrical conductor.
Figure 13:
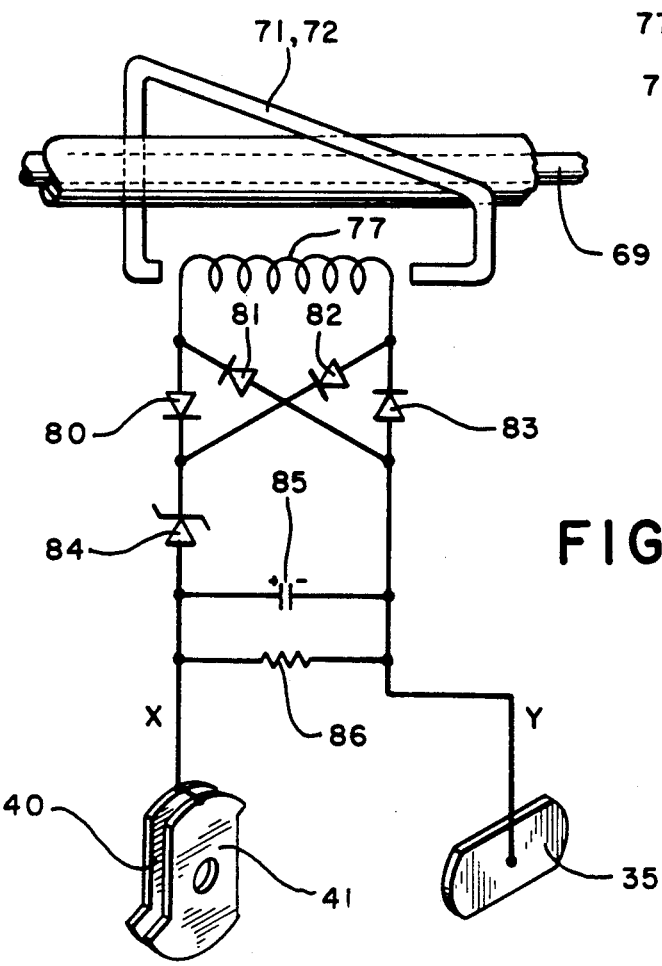
FIG. 13 is an electrical schematic diagram of the cable-mounted fault indicator of FIGS. 11 and 12.

As shown in FIGS. 12 and 13, a pick-up coil 77 is magnetically coupled to conductor 12 such that a voltage is induced in the coil commensurate with current flow through conductor 12. The voltage thus induced in coil 77 is rectified by a full-wave bridge rectifier network comprising diodes 80-83 to develop a DC voltage proportional to current flow. When this voltage exceeds the threshold voltage of a series-connected zener diode 84 a capacitor 85 is charged by the network. Capacitor 85 establishes an electrostatic gradient between the "X" and "Y" members which causes the indicator flag to rotate to its fault-indicating position in the manner previously described. A resistor 86 connected across capacitor 85 allows capacitor 85 to slowly discharge in the absence of a fault current so that the fault indicator is reset after a period of time.

It has been found that the indicator flag may be advantageously constructed utilizing an aluminized 1.5 mil thick material such as "Mylar" (a trademark of DuPont Corporation). In the construction of FIG. 9 with a 5000 volt monitored conductor a capacitor having a capacity of 0.01 microfarad, and charged to approximately 1000 volts by use of type 1N4007 diodes, may be used to develop the required electrostatic potential for deflecting the indicator flag. The diodes serve a secondary function of limiting the voltage developed on the capacitor by breaking down upon attaining their peak inverse voltage. The high impedance of the test point, typically in the order of 1.0 megohms, prevents damage to the diodes upon such reverse conduction.

In the alternate construction of FIG. 10, the input capacitor may have a capacity of 0.1 microfarads and the actuating capacitor may have a capacity of 0.01 microfarads. The current limiting resistor may have a value of from 1 megohm to 100,000 ohms.

It will be appreciated that the indicator assembly can be constructed to have different time constants and to operate from different voltages by appropriate selection of components. Furthermore, while the indicator has been shown in conjunction with manually-reset and self-resetting fault indicators, it will be appreciated that the indicator assembly may be used in other circuit applications where it is desired to respond to an input control effect and indicate such occurrence to a user without the use of magnetic windings and associated pole pieces.

While a particular embodiment of the invention has been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

I claim:

1. A fault indicator for indicating the occurrence of a fault current in an electrical conductor, comprising, in combination:

a housing;

an indicator flag mounted in said housing for movement between a fault-indicating position and a reset-indicating position;

electrostatic actuator means including at least an actuator electrode positioned for exerting an electrostatic force on said indicator flag;

circuit means electrically connected to said actuator electrode for establishing an electric field between said actuator electrode and said indicator flag to exert an electrostatic force on said indicator flag to position said indicator flag to a selected one of said indicating positions;

biasing means comprising a permanent magnet for positioning said indicator flag to the other of said indicating positions in the absence of said electric field; and said circuit means being responsive to the occurrence of a fault current in the electrical conductor to position said indicator flag to said fault-indicating position.

2. A fault indicator as defined in claim 1 wherein said housing includes a window whereby said indicator flag is visible from the exterior of said housing only in said fault-indicating position.

3. A fault indicator as defined in claim 1 wherein said biasing means comprise a first permanent magnet fixedly mounted to said housing and a second permanent magnet mounted on and rotatable with said indicator flag.

4. A fault indicator as defined in claim 3 wherein said second permanent magnet comprises a strip of magnetizable tape carried on said indicator flag.

5. A fault indicator as defined in claim 1 wherein said indicator flag is pivotally mounted to rotate between said fault indicator position and said reset-indicating position.

6. A fault indicator as defined in claim 1 wherein said circuit means include a capacitor and means for charging said capacitor from the electrical conductor.

7. A fault indicator as defined in claim 6 wherein one terminal of said capacitor is connected to said actuator electrode and the other terminal of said capacitor is connected to said indicator flag.

8. A fault indicator as defined in claim 7 wherein said circuit means position said indicator flag to said reset-indicating position prior to occurrence of said fault current, and said circuit means include fault-responsive means for discharging said capacitor upon occurrence of a fault current whereby said biasing means cause said indicator flag to move to said fault indicating position.

9. A fault indicator as defined in claim 8 wherein said fault responsive means comprise a reed switch electrically coupled to said capacitor and in magnetic communication with the monitored conductor.

10. A fault indicator as defined in claim 7 wherein said circuit means position said indicator flag to said fault-indicating position, and said capacitor charging means include a second capacitor charged from the monitored electrical conductor, and means for charging said first capacitor from said second capacitor upon occurrence of a fault current.

11. A fault indicator as defined in claim 5 wherein said indicator flag actuator electrode extends along a position of and in a plane generally parallel to the arcuate path of travel of said indicator flag.

12. A fault indicator as defined in claim 5 wherein said actuator means comprise a pair of actuator electrodes arranged on opposite sides of and adjacent to said indicator flag along a portion of and in a plane generally parallel to the arcuate path of travel thereof.

13. An electrostatically-actuated indicator for indicating one of two alternative conditions in response to an applied control effect, comprising, in combination:

a housing;

an indicator flag mounted in said housing for movement between a first indicating position and a second indicating position;

electrostatic actuator means including at least one actuator electrode positioned for exerting an electrostatic force on said indicator flag;

circuit means electrically connected to said actuator electrode for establishing an electric field between said actuator electrode and said indicator flag to exert an electrostatic force on said indicator flag to position said indicator flag to a selected one of said indicating positions;

biasing means comprising a permanent magnet for positioning said indicator flag to the other of said indicating positions in the absence of said electric field; and said circuit means being responsive to the applied control effect in positioning said indicator flag to said first indicating position.

14. An electrostatically-actuated indicator as defined in claim 13 wherein said housing includes a window whereby said indicator flag is visible from the exterior of said housing in only one of said indicating positions.

15. An electrostatically-actuated indicator as defined in claim 13 wherein said biasing means further include a strip of magnetizable tape carried on said indicator flag.

16. An electrostatically-actuated indicator as defined in claim 13 wherein said indicator flag is pivotally mounted to rotate between said first indicating position and said second indicating position.

17. An electrostatically-actuated indicator as defined in claim 16 wherein said one actuator electrode extends along a portion of and in a plane generally parallel to the arcuate path of travel of said indicator flag.

18. An electrostatically-actuated indicator as defined in claim 16 wherein said actuator means comprise a pair of actuator electrodes arranged on opposite side of and adjacent to said indicator flag along a portion of and in a plane generally parallel to the arcuate path of travel thereof.

19. An electrostatically-actuated indicator as defined in claim 13 wherein said circuit means include a capacitor and means for charging said capacitor.

20. An electrostatically-actuated indicator as defined in claim 19 wherein one terminal of said capacitor is connected to said actuator electrode and the other terminal of said capacitor is connected to said indicator flag.

21. An electrostatically-actuated indicator as defined in claim 20 wherein said circuit means position said indicator flag to said second indicating position, and said circuit means include control effect response means for discharging said capacitor in response to the applied control effect.

22. An electrostatically-actuated indicator as defined in claim 21 wherein said control effect response means comprise switch means electrically coupled to said capacitor.

23. An electrostatically-actuated indicator as defined in claim 20 wherein said circuit means condition said indicator flag to said first indicating position, and said capacitor charging means include a second capacitor charged from the monitored electrical conductor, and means for charging said first capacitor from said second capacitor in response to the applied control effect.

* * * * *